(12) United States Patent
Yudovsky

(10) Patent No.: US 6,994,319 B2
(45) Date of Patent: Feb. 7, 2006

(54) MEMBRANE GAS VALVE FOR PULSING A GAS

(75) Inventor: Joseph Yudovsky, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 163 days.

(21) Appl. No.: 10/354,600

(22) Filed: Jan. 29, 2003

(65) Prior Publication Data

US 2004/0144308 A1    Jul. 29, 2004

(51) Int. Cl.
 F16K 31/44    (2006.01)
(52) U.S. Cl. ...................................... 251/263; 251/331
(58) Field of Classification Search ................. 251/262, 251/263, 331, 335.2, 251; 137/595; 417/510
 See application file for complete search history.

(56) References Cited

U.S. PATENT DOCUMENTS

| | | | |
|---|---|---|---|
| 1,633,044 A | * | 6/1927 | Soubier ........................ 65/332 |
| 3,409,048 A | * | 11/1968 | Brown ......................... 137/635 |
| 3,960,121 A | | 6/1976 | Backus |
| 4,058,430 A | | 11/1977 | Suntola et al. |
| 4,107,008 A | | 8/1978 | Horvath |
| 4,176,651 A | | 12/1979 | Backus |
| 4,389,973 A | | 6/1983 | Suntola et al. |
| 4,413,022 A | | 11/1983 | Suntola et al. |
| 4,436,090 A | | 3/1984 | Darling |
| 4,543,991 A | * | 10/1985 | Fuchs .......................... 137/595 |
| 4,662,399 A | * | 5/1987 | Buchner et al. ....... 137/625.17 |
| 4,700,735 A | * | 10/1987 | Hamernik et al. .......... 137/270 |
| 4,834,831 A | | 5/1989 | Nishizawa et al. |
| RE33,270 E | * | 7/1990 | Beck et al. ................. 123/447 |
| 4,953,595 A | | 9/1990 | Kotlyar |
| 4,993,357 A | | 2/1991 | Scholz |
| 5,038,866 A | | 8/1991 | Kern et al. |
| 5,225,366 A | | 7/1993 | Yoder |
| 5,275,137 A | * | 1/1994 | Uesugi .................... 123/90.16 |
| 5,281,274 A | | 1/1994 | Yoder |
| 5,294,286 A | | 3/1994 | Nishizawa et al. |
| 5,298,710 A | | 3/1994 | Acheson et al. |
| 5,316,042 A | | 5/1994 | Lim et al. |
| 5,353,838 A | | 10/1994 | Grant |
| 5,374,570 A | | 12/1994 | Nasu et al. |
| 5,441,703 A | | 8/1995 | Jurgensen |
| 5,443,647 A | | 8/1995 | Aucoin et al. |
| 5,480,818 A | | 1/1996 | Matsumoto et al. |
| 5,483,919 A | | 1/1996 | Yokoyama et al. |
| 5,503,875 A | | 4/1996 | Imai et al. |
| 5,674,786 A | | 10/1997 | Turner et al. |
| 5,711,811 A | | 1/1998 | Suntola et al. |
| 5,796,116 A | | 8/1998 | Nakata et al. |
| 5,807,792 A | | 9/1998 | Ilg et al. |
| 5,835,677 A | | 11/1998 | Li et al. |
| 5,850,853 A | * | 12/1998 | Ohmi et al. ................ 137/606 |
| 5,855,680 A | | 1/1999 | Soininen et al. |

(Continued)

FOREIGN PATENT DOCUMENTS

EP    1167569    1/2002

(Continued)

*Primary Examiner*—Edward K. Look
*Assistant Examiner*—John K. Fristoe, Jr.
(74) *Attorney, Agent, or Firm*—Patterson & Sheridan LLP

(57) ABSTRACT

A gas valve for pulsing a gas comprises a housing having an inlet port, an outlet port, a membrane, and an actuator, wherein the actuator selectively engages the membrane with the inlet port. In one embodiment, a plurality of the gas valves are coupled together to form an apparatus for synchronized pulsing of a plurality of individual gases.

20 Claims, 7 Drawing Sheets

U.S. PATENT DOCUMENTS

| | | | |
|---|---|---|---|
| 5,879,459 | A | 3/1999 | Gadgil et al. |
| 5,913,329 | A | 6/1999 | Haynes et al. |
| 5,916,365 | A | 6/1999 | Sherman |
| 6,015,590 | A | 1/2000 | Suntola et al. |
| 6,042,652 | A | 3/2000 | Hyun et al. |
| 6,139,700 | A | 10/2000 | Kang et al. |
| 6,174,377 | B1 | 1/2001 | Doering et al. |
| 6,183,563 | B1 | 2/2001 | Choi et al. |
| 6,200,893 | B1 | 3/2001 | Sneh |
| 6,231,672 | B1 | 5/2001 | Choi et al. |
| 6,270,572 | B1 | 8/2001 | Kim et al. |
| 6,305,314 | B1 | 10/2001 | Sneh et al. |
| 6,306,216 | B1 | 10/2001 | Kim et al. |
| 6,447,607 | B2 | 9/2002 | Soininen et al. |
| 6,478,872 | B1 | 11/2002 | Chae et al. |
| 6,481,945 | B1 | 11/2002 | Hasper et al. |
| 6,511,539 | B1 | 1/2003 | Raaijmakers |
| 6,551,406 | B2 | 4/2003 | Kilpi |
| 6,818,094 | B2 | 11/2004 | Yudovsky |
| 6,868,859 | B2 | 3/2005 | Yudovsky |
| 2001/0000866 | A1 | 5/2001 | Sneh et al. |
| 2001/0009140 | A1 | 7/2001 | Bondestam et al. |
| 2001/0011526 | A1 | 8/2001 | Doering et al. |
| 2001/0013312 | A1 | 8/2001 | Soininen et al. |
| 2001/0014371 | A1 | 8/2001 | Kilpi |
| 2001/0042523 | A1 | 11/2001 | Kesala |
| 2001/0042799 | A1 | 11/2001 | Kim et al. |
| 2001/0054377 | A1 | 12/2001 | Lindfors et al. |
| 2002/0000196 | A1 | 1/2002 | Park |
| 2002/0007790 | A1 | 1/2002 | Park |
| 2002/0041931 | A1 | 4/2002 | Suntola et al. |
| 2002/0052097 | A1 | 5/2002 | Park |
| 2002/0086106 | A1 | 7/2002 | Park et al. |
| 2002/0092471 | A1 | 7/2002 | Kang et al. |
| 2002/0094689 | A1 | 7/2002 | Park |
| 2002/0108570 | A1 | 8/2002 | Lindfors |
| 2002/0134307 | A1 | 9/2002 | Choi |
| 2003/0004723 | A1 | 1/2003 | Chihara |
| 2003/0075273 | A1 | 4/2003 | Kilpela et al. |
| 2003/0075925 | A1 | 4/2003 | Lindfors et al. |

FOREIGN PATENT DOCUMENTS

| | | |
|---|---|---|
| JP | 58-098917 | 6/1983 |
| JP | 04-291916 | 9/1992 |
| JP | 05-047666 | 2/1993 |
| JP | 05-206036 | 8/1993 |
| JP | 05-234899 | 9/1993 |
| JP | 05-270997 | 10/1993 |
| JP | 06-224138 | 5/1994 |
| JP | 2000-319772 | 3/2000 |
| JP | 2001-020075 | 11/2000 |
| WO | WO 96/17107 | 6/1996 |
| WO | WO 99/01595 | 1/1999 |
| WO | WO 99/65064 | 12/1999 |
| WO | WO 00/54320 | 9/2000 |
| WO | WO 00/79576 | 12/2000 |
| WO | WO 01/17692 | 3/2001 |
| WO | WO 01/36702 | 5/2001 |
| WO | WO 02/08488 | 1/2002 |

* cited by examiner

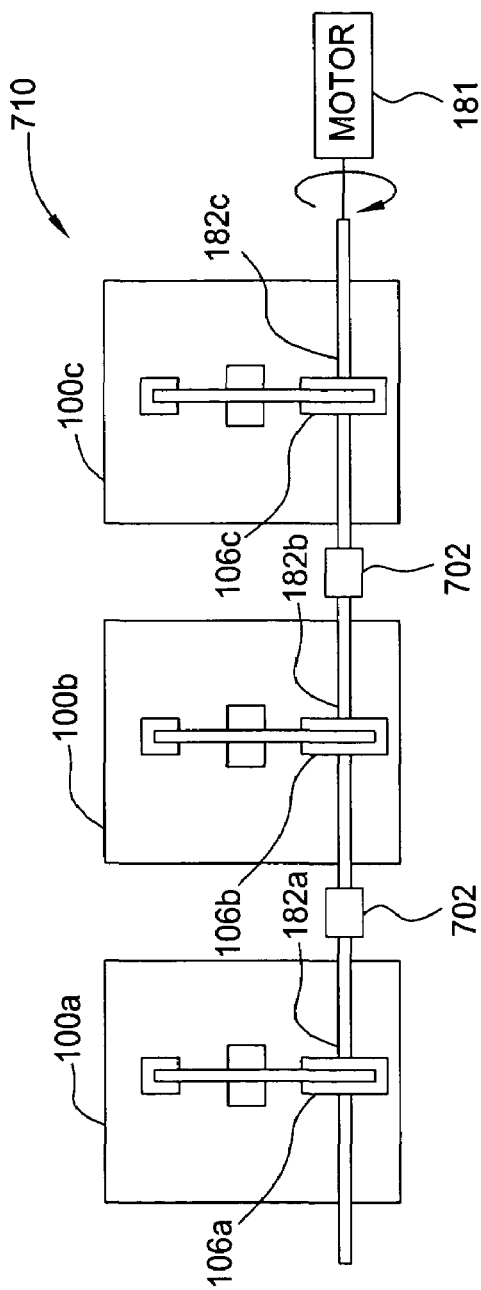
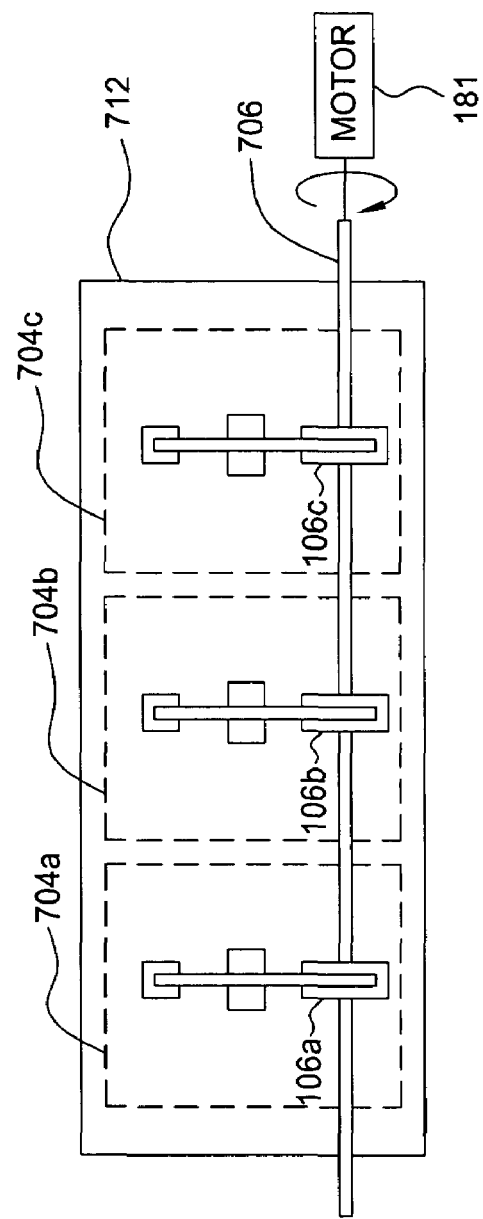
FIG. 7A
FIG. 7B

MEMBRANE GAS VALVE FOR PULSING A GAS

BACKGROUND OF THE INVENTION

1. Field of the Invention

The present invention generally relates to semiconductor substrate processing systems. More particularly, the present invention relates to a gas valve for pulsing of one or more gases used in a semiconductor substrate processing system.

2. Description of the Related Art

In cylindrical film processing, for example, atomic layer deposition, atomic layer etch or other repetitive, thin film deposition or etch process, is desirable to provide rapid and precise cycling of process gases to improve the production worthiness of processing systems. In this regard, valves that may reliably inject small amounts of materials at rapid rates are needed. Some current and desired feature cylindrical layer deposition processes will require injection sequences wherein a single pulse may be as short as a few tens of milliseconds and be separated from an adjacent pulse by a few tens of milliseconds. Providing such pulses of gas using conventional solenoid or pneumatically operated valves have not proven desirable for this use due to insufficient responsiveness, i.e., long cycle times, failure to shut off cleanly, high rate of particulate generation and poor reliability and short service life. These deficiencies lead to sub-optimal physical properties of the positive films, short service life and high maintenance frequencies.

Therefore, there is a need for a valve for pulsing gas during cylindrical processes such as atomic layer deposition and the like.

SUMMARY OF THE INVENTION

The present invention is a membrane gas valve for pulsing gases (or gas mixtures). The inventive gas valve comprises a gas inlet port and a gas outlet port that are periodically engaged in fluid communication by a membrane controlled by a selector cam. The selector cam comprises at least one timing lobe to establish and terminate a flow of the gas (or gas mixture). In one embodiment, the inventive gas valve produces pulses having a duration of about 50 to 300 msec of three gases. In another embodiment, a plurality of the inventive gas valves are coupled together to form an apparatus for synchronized pulsing of a plurality of individual gases (or gas mixtures). In one application for the invention, the membrane gas valve is used for pulsing a reactive precursor and purge gases during an atomic layer deposition process performed in a semiconductor substrate processing system.

BRIEF DESCRIPTION OF THE DRAWINGS

The teachings of the present invention can be readily understood by considering the following detailed description in conjunction with the accompanying drawings, in which:

FIGS. 7A and 7B are schematic, top plan views of embodiments of the invention used for pulsing of a plurality of separate gases.

To facilitate understanding, identical reference numerals have been used, where possible, to designate identical elements that are common to the figures.

It is to be noted, however, that the appended drawings illustrate only illustrative embodiments of this invention and are therefore not to be considered limiting of its scope, for the invention may admit to other equally effective embodiments.

DETAILED DESCRIPTION

The present invention is a membrane gas valve for pulsing one or several gases (or gas mixtures) to form a sequence of pulses of the gas. Herein the terms gas and gas mixture are used interchangeably. The gas is generally supplied to the gas valve as a non-pulsed pressurized gas.

The gas valve comprises a gas inlet port and a gas outlet port that are periodically engaged in fluid communication by a membrane member (referred to herein as a membrane). The membrane is controlled by a selector cam comprising at least one timing lobe. When the selector cam rotates, the timing lobe periodically facilitates establishing and terminating a flow of gas through the valve. As such, a rotary motion of the selector cam results in pulsing of the gas. In one embodiment of the invention, the gas valve produces pulses having a duration of about 50 to 300 msec.

In another embodiment, a plurality of the inventive gas valves are coupled to one another to form an apparatus for synchronized pulsing of individual gases. In one exemplary application, the invention is used for pulsing of three gases (e.g., reactant and purge gases) during a cyclical deposition process such as an Atomic Layer Deposition (ALD) process that is performed in a semiconductor substrate processing system.

Figure 1:
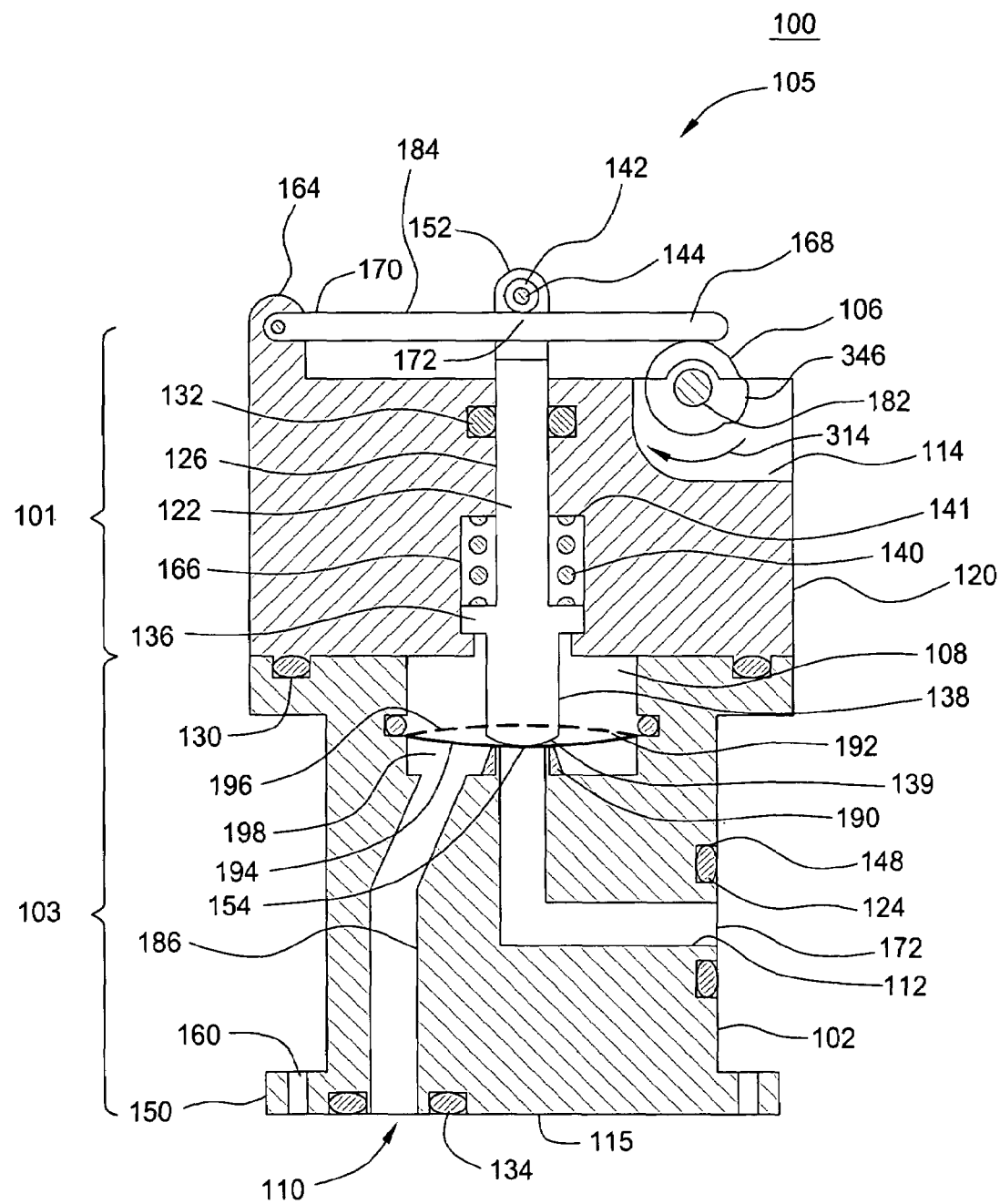
FIG. 1 is a schematic, cross-sectional view of a gas valve in accordance with one embodiment of the present invention.
Figure 2:
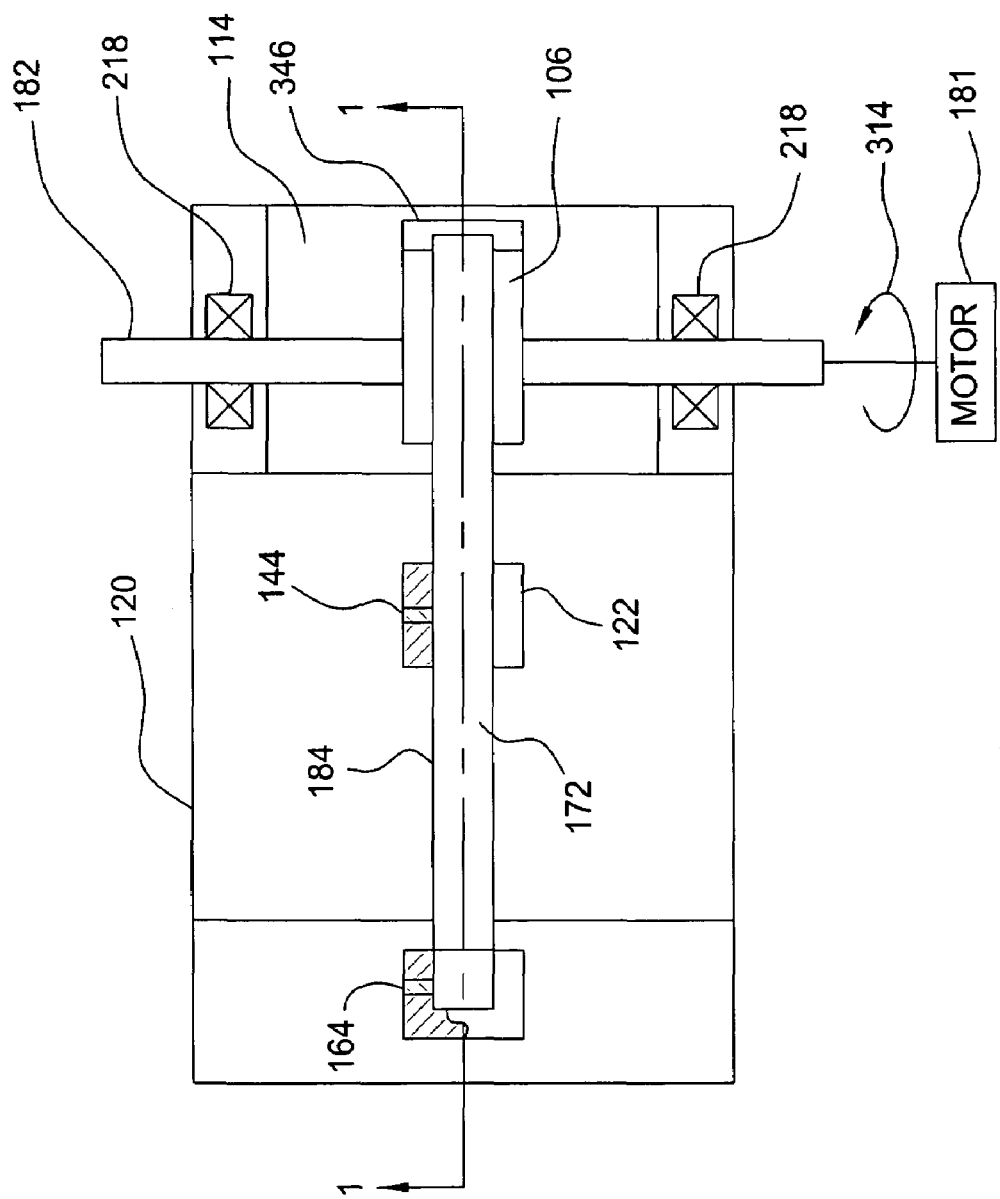
FIG. 2 is a schematic, top plan view of the gas valve of FIG. 1.
Figure 3:
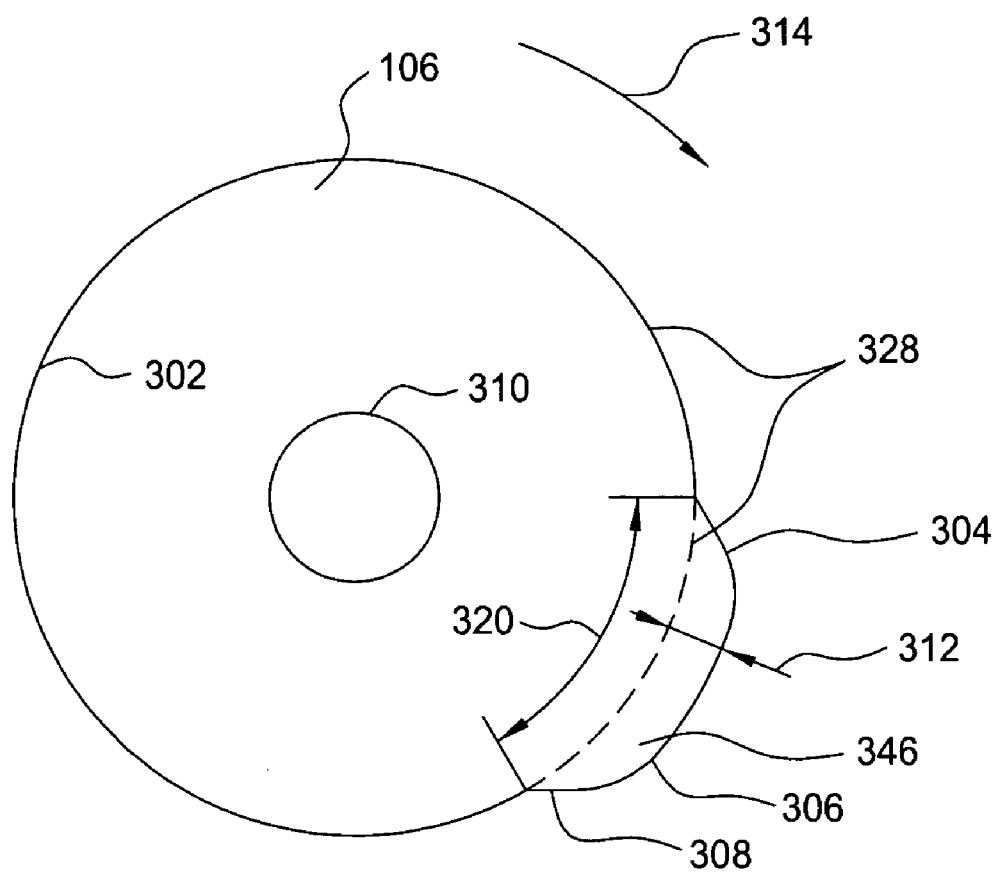
FIG. 3 is a top plan view of one embodiment of the cams of the gas valve of FIG. 1.

FIG. 1 and FIG. 2 are, respectively, schematic, cross-sectional and top plan views of a rotary gas valve 100 in accordance with one embodiment of the present invention. The cross-sectional view in FIG. 1 is taken along a center-line 1—1 in FIG. 2. FIG. 3 is a schematic, top plan view of one embodiment of a selector cam 106. For best understanding of this embodiment of the invention, the reader should simultaneously refer to FIGS. 1–3. The images in FIGS. 1–3 are simplified for illustrative purposes and not depicted to scale.

The membrane gas valve 100 comprises an upper portion 101, a lower portion 103, and an actuator assembly 105. In one embodiment of the invention, the upper portion 101 comprises an upper housing 120 that defines a shaft guide 126 and a groove 131 for a shaft seal 132. The lower portion 103 comprises an inlet gas channel 112, an outlet gas channel 186, a chamber 108, and a lower housing 102. The gas channels 112 and 186 form an inlet port and an outlet port, respectively, for the valve 100. The lower housing 102 further comprises a mounting flange 150 and seals 124, 130, and 134. The flange 150 is provided with openings 160 for mounting the valve 100 upon a gas receiving assembly. A membrane 192 is supported within the chamber 108 by the lower housing 102. A valve seat 190 circumscribes one end of the gas channel 112 such that the membrane 192 is positioned proximate the valve seat 190.

In one embodiment, the chamber 108 has an internal volume in a range of about 1 to 3 cm³ or less. A small internal volume of the chamber 108 can be gas pressurized more rapidly. As such, the valve 100 can produce pulses of gas rapidly, i.e., at a high rate, and the pulses, which comprise substantially sharp leading and trailing edges.

The gas channels 112 and 186 are adapted for passing of a gas through the lower housing 102 and formed as openings, e.g., cylindrical openings. Length and form factors of a gas channel are selected to provide a high ratio of gas conductance through an internal volume of the channel.

The inlet gas channel 112 couples the chamber 108 to a source of the gas. The inlet gas channel 112 comprises an inlet port 172 and an outlet port 154. The inlet port 172 is supplied with a groove 148 located near the inlet port and comprising a sealing element 124. The groove 148 houses a sealing element 124 that is adapted to provide a vacuum-tight coupling to an external gas line that delivers a respective gas to the inlet of the gas channel. The sealing element 124 may comprise at least one vacuum-grade O-ring, a vacuum-tight fitting, and the like. Other forms of vacuum couplers may be used to connect the channels to various gas suppliers. The vacuum-grade O-ring generally is formed from a polymeric material such as synthetic or natural rubber, a metal or metal alloy, and the like. Furthermore, the inlet port 172 may additionally comprise a vacuum-tight shut-off valve to isolate a gas channel from the external environment when the gas channel is not used during a specific deposition process, e.g., the ALD process. The outlet port 154 is terminated by the valve seat 190 that is disposed in the chamber 108. The seat 190 forms a vacuum-tight coupling with the chamber 108 and is adapted for providing a momentarily vacuum-tight coupling with the membrane 192 (discussed in detail in reference to operation of the actuator 105 below).

The outlet gas channel 186 couples the chamber 108 to a gas receiving assembly. The outlet gas channel 186 comprises an inlet port 194 and an outlet port 110. The inlet port 194 is disposed in the chamber 108 and the outlet port 110 generally is disposed in a manner that it forms a path having a high gas conductance to the intake port of a recipient assembly for the gas, e.g., in a bottom surface 115 of the lower housing 102.

The lower housing 102 comprises seals 134 and 130, while the upper housing 120 comprises a seal 132. The seals protect the interior of the valve 100 from external environment. The seal 134 and 130 are static seals. The seal 134 provides a vacuum-tight coupling between the lower housing 102 and to the gas receiving assembly, while the seal 130 provides a vacuum-tight coupling between the lower housing 102 and the upper housing 120. The seal 132 is a sliding seal that provides a vacuum-tight coupling between the upper housing 120 and the shaft 122 during the reciprocating motion the shaft. In one embodiment, each of the seals 130, 132, and 134 comprises at least one vacuum-grade O-ring and a slot for receiving the O-ring. In an alternative embodiment, at least one of the seals 130, 132, and 134 may be a pumped or double-pumped seal.

The parts of the valve 100 may be exposed to a chemically aggressive gases, e.g., a reactive precursor gas used during a cyclical deposition process, generally are fabricated from or coated with chemically resistant materials that do not substantially react with such gases. In one embodiment, examples of such chemically resistant materials comprise polytetrafluoroethylene (PTFE), polychlorotriflouroethylene (PCTFE), perfluoroalkoxy (PFA), polyimide, and the like. In other embodiments, may be used materials such as ceramic, a metal, a metal alloy, and the like.

In some applications, during a deposition process, the valve lower housing 102 is maintained at a temperature of about 90 degrees Celsius to prevent condensation of the gas(es) inside the valve. One of materials that is resistant, at such temperatures, to many conventional reactant gases (e.g., comprising ammonia ($NH_4$)) is polyimide VESPEL® CR-6100, which is available from DuPont Company, Wilmington, Del. The valve 100 may further be adapted to means of heating and/or cooling the internal parts of the valve, as well as the gases within the valve to accommodate various processing requirements. Such means (not shown) may comprise an external heating element (e.g., a flexible resistive heater), embedded electrical heaters (e.g., heaters disposed around the valve chamber 108), and the like, as well as a cooling/heating plumbing (e.g. liquid containing conduit) that is thermally coupled to the lower housing 102.

The actuator assembly 105 comprises a pushing shaft 122, a bias member (e.g., a spring) 140, a lever 184, a roller 142, a selector cam 106, a driving shaft 182, bearings 218, a seal 132, and axles 142 and 164. The shaft 122 is disposed in a guide 126 in the upper housing 120. A first end 152 of the shaft 122 is coupled to a lever 184 using a roller 142. The roller 142, e.g., an anti-friction bearing, is disposed on an axle 144. A first end 170 of the level 184 is pivotly coupled to the upper housing 120 using an axle 164. A midpoint 172 of the lever 184 contacts the roller 142. In one embodiment, in operation, the roller 142 decreases a friction of a contact between the lever 182 and the shaft 122. A second end 168 of the lever 184 is pressed against the outer surface 302 of the selector cam 106 by the elastic force of the bias member 140. The elastic force is applied to the lever 184 at the midpoint 172 using the roller 142.

A second end 138 of the shaft 122 is disposed in the chamber 108 and provided with a rounded contact surface 139. The shaft 122 controls a tripping motion of the membrane 192 from a free state position 196 (depicted in FIG. 1 as a broken line) to a sealing position 198 upon the seat 190 (depicted in FIG. 1 as a solid line). The position 196 coincides with or below an upmost point in the traveling path of the shaft 122, while the position 198 relates to a downmost point in a traveling path of the shaft 122.

The selector cam 106 controls the angular position of the lever 184. As such, in operation, the selector cam 106 controls the longitudinal position of the shaft 122 and the tripping motion of the membrane 192 between the positions 196 and 198. The selector cam 106 comprises at least one timing lobe 346. The selector cam 106 coupled to the driving shaft 182. A position of the selector cam 106 on the driving shaft 182 may be fixed, e.g., using a set screw (not shown) and the like. In one embodiment, the selector cam 106 and the driving shaft 182 may form a single part. Either end of the driving shaft 182 may be coupled to a drive (e.g. motor 181), which, in operation, rotates the shaft 182. Generally, the driving shaft 182 is disposed in a recess 114 of the upper housing 120 and is supported by plain or ball bearings 218. The drive may comprise a controlled electro-mechanical motor, a stepper motor, and the like.

During operation, a rotation of the driving shaft 182 and the selector cam 106 translates in an oscillating motion of the lever 184. The lever 184 periodically bears against the roller 142 and lifts the shaft 122. A combination of a lifting force exerted by the lever 184 and an elastic force exerted by the bias member 140 facilitates a reciprocating motion of the shaft 122 in the guide 126. Such motion of the shaft 122 results in periodic tripping of the membrane 192 between the free state position 196 and the sealing, or closed, position 198.

In one embodiment, the membrane 192 is a rigid elastic membrane, formed from, for example, a CoNi alloy and the like. When the membrane 192 is in a free state, it naturally adapts to the position 196 away from the seat 190. When the membrane 192 is in the position 196, the gas may freely flow through the inlet gas channel 112, the chamber 108, and the outlet gas channel 186 to a recipient port for the pulsed gas. When the membrane 192 is pushed down by the shaft 122 into the sealing position 198, the membrane forms with the seat 190 a momentary vacuum-tight compressive seal. Such seal terminates a flow of gas from the channel 112 into the chamber 108. As such, cyclical traveling of the membrane 192 between the positions 196 and 198 facilitates pulsing of the gas.

In the depicted embodiment, the bias member 140 is disposed in a cavity 166. The bias member 140 is, for example, a spring that is compressed between a spring seat 141 of the upper housing 120 and a flange 136. The bias member 140 may comprise at least one concentric bias member element. In one embodiment, the flange 136 is coupled to the shaft 122. Alternatively, the shaft 122 and the flange 136 may be formed as a single part. When preloaded, the bias member 140 exerts an expanding elastic force applied to the flange 136. Such force causes the shaft 122 to slide down until the membrane 192 has reached the compressive seal position 198. As discussed above, the opposing surfaces of the membrane 192 and the seat 190 are formed in a manner that form a vacuum-tight seal between the solid portions of the surfaces when pushed against each other by the elastic force of the bias member 140. In one embodiment, a sealing contact between the surfaces is formed using fine machining of the surfaces, such as polishing and the like.

In other embodiments, any apparatus or element is considered a bias member 140 that facilitates reciprocating motion of the shaft 122 and maintains adequate contact between the shaft 122 and the membrane 192 to promote gas flow through the valve. In further embodiments, the actuator using the selector cam 106 and lever 184 to move the shaft 122 up and down may be replaced with a solenoid or other actuator that forces the shaft to reciprocate in the guide 126.

For the purposes of assembly of the housing assembly 104, the flange 136 and the opening 156 may comprise, e.g., mating keys (not shown) such as opposing flats and the like. In one embodiment, after the keys were aligned and the flange 136 and the bias member 140 have passed into the cavity 166, the shaft 122 is turned, e.g., by 90 degrees, to lock the flange and the bias member in the cavity. One skilled in the art will readily envision other conventional assembling procedures for the bias member 140 and the shaft 122.

Referring to FIG. 3, the selector cam 106 comprises a central opening 310 for the driving shaft 182 and at least one timing lobe 346 disposed upon an outer surface 302 of the cam. The timing lobe 346 comprises a plateau region 306 and, with respect to a selected clockwise direction of rotation of the selector cam 106 (indicated by an arrow 314), an accelerating region 308 and a decelerating region 304. The outer surface 302 generally coincides with a circle 328 (depicted as a combination of solid and dashed lines), which is substantially concentric with the opening 310. A height 312 of the plateau region 306 is selected to be sufficient to lift the shaft 122 using the lever 184 above the free state position 196 of the membrane 192. A length of the timing lobe 320 relates to a duration of a pulse of gas, as discussed below.

In other embodiments, the selector disk 106 may comprise a plurality of timing lobes wherein each lobe is formed, disposed, and operates similar to the lobe 346. Further, the regions 304 and 308 may be profiled, e.g., such that, in operation, the timing lobe 346 can facilitate a predetermined rate of changes in a gas flow through the valve 100. For example, the regions 304 and 308 may be profiled to provide a smooth transition between the ON and OFF periods (discussed in reference to FIGS. 4 and 5 below). Such selector cam 106 may be formed using conventional machining techniques such as milling, molding, and the like.

The regions 306 and 302 relate, respectively, to the upmost and downmost positions of the lever 184 and the shaft 122. As such, during a period when the lever 184 is engaged in a contact with the region 306, the membrane 192 naturally adapts to the free state position 196. Similarly, during a period when the lever 184 engaged in a contact with the region 302, the membrane 192 is pushed by the shaft 122 into the closed position 198. In operation, the accelerating region 308 relates to a transition path of the membrane 192 from the closed position 198 to the free state position 196. Similarly, the decelerating region 304 relates to the transition path of the membrane 192 from the position 196 to the position 198. In operation, when the timing lobe 346 lifts the lever 184 and the shaft 122 to the upmost position, the selector cam 106 establishes a momentary state of fluid communication in the path from the inlet gas channel 112 to the outlet gas channel 110. In an alternative embodiment, when the selector cam 106 comprises more than one timing lobe 346, the lever 184, shaft 122 and membrane 192 respond, as describe above, to each timing lobe. A number of produced pulses of gas increases when the selector cam 106 rotates faster or comprises more than one timing lobe 346.

Figure 4:
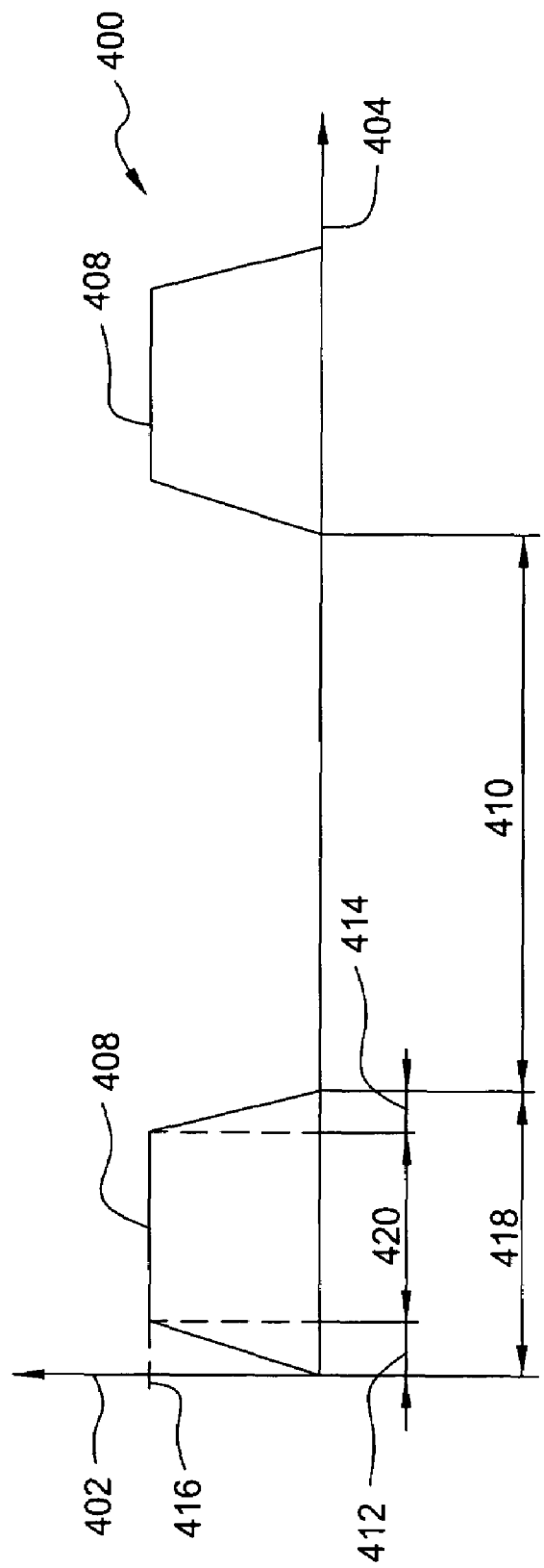
FIG. 4 is an exemplary graph of a pulse of gas produced by the valve of FIG. 1.

FIG. 4 is an exemplary graph of a responsiveness R of the gas valve 100. The term "responsiveness" as used herein relates to a value $R=1/(T_4+T_5)$, where $T_4$ and $T_5$ are time periods needed to stabilize a gas flow through the valve during a pulse of gas at the beginning and at the end of the pulse, respectively. Specifically, a graph 400 depicts a value of a flow of gas through the output port 110 (axis 402) versus time (axis 404). In should be noted that images in FIG. 4 are simplified and not depicted to scale.

When the selector cam 106 rotates, the flow of the gas from the inlet gas channel 112 is periodically pulsed. Each pulse 408 has a duration 418 of $T_1=L_T/CW$, and a period 410 between the pulses 408 has a duration of $T_2=1/W-T_1$. Here W—angular velocity of the selector cam 106, C—a length of the circle 328, and $L_T$—the length 320 of the timing lobe 346. The pulse 408 comprises a leading edge 412 having a duration $T_4$, a trailing edge 414 having a duration $T_5$, and a steady state period 420 related to a flow rate 416. The period 412 relates to transition of the gas flow from the OFF state (i.e., no gas flow) to the ON state (i.e., a gas flow at the rate 416). As such, the period 412 relates to a duration of a contact between the lever 184 and the region 308 of the rotating clockwise timing lobe 346, as indicated by the arrow 314 above. Similarly, the period 414 relates to the transition from the ON state to the OFF state and to a duration of a contact between the lever 184 and the region 304 of the lobe 346.

The valve 100 having a greater value of the responsiveness R may produce more pulses 408 over a period time, i.e., may form the pulses of gas at a higher rate. The responsiveness of the valve 100 increases when increases the conductance of a gas path that is collectively formed by the inlet gas channel 112, the chamber 108, and the outlet gas channel 186. Further, the responsiveness of the valve 100 increases when the internal volume of the gas valve 100 decreases.

It should be noted that the valve 100 does not have any limitation for a maximum duration of pulses of gas that the valve produces. A duration of the pulses may be increased, e.g., by decreasing a velocity of the rotary motion of the selector cam 106. A duration of the pulses may be increased, e.g., by decreasing an angular velocity of rotation of the selector cam 106. Also, by modulating the angular velocity of the selector cam 106 when the timing lobe 346 engages the lever 184, the responsiveness profile may be altered for the leading and trailing edges of the gas pulse.

In one exemplary embodiment, the gas channels 112 and 186 have a circular form factor with a diameter of 3 mm and a length of the outlet gas channel 186 of 25 mm. In this embodiment, the selector cam 106 rotates at an angular velocity of 4 revolutions per second, comprises one timing lobe 346 having a length of 6 mm and disposed along the circle 128 having a length of 30 mm. Further, the chamber 108 has an internal volume available to a gas of about 1 to 3 $cm^3$. In this example, the gas valve 100 forms pulses of gas having a duration of about 50 msec with a cutoff period between pulses of about 200 msec. In an alternative exemplary embodiment, the selector cam 106 has two oppositely disposed timing lobes, and the pulses of gas have a duration of about 50 msec msec with a cutoff period between pulses of about 75 msec. In other exemplary embodiments, the valve 100 produced pulses of gas having a duration of about 50 to 300 msec or longer and had a responsiveness of about 10 to 30 msec or less.

FIGS. 7A and 7B are schematic, top plan views of two embodiments of the invention when the valve 100 is used for pulsing a plurality of separate gases, e.g., reactant and purge gases during the ALD process. The images in FIGS. 7A and 7B, with respect to related images in FIG. 2, are further simplified for purposes of clarity.

In FIG. 7A, in a first embodiment, three individual valves 100*a*, 100*b*, and 100*c* are connected together to form an integrated apparatus 710 for synchronized pulsing of three individual gases. In one embodiment, the valves 100*a*, 100*b*, and 100*c* are connected, e.g., using couplings 702, in a manner that the driving shafts 182*a*, 182*b*, and 182*c* of the respective valves 100*a*, 100*b*, and 100*c* are sequentially coupled together. Alternatively, the driving shafts of the individual valves may be replaced with a common driving shaft (not shown). In other embodiments, a number of the connected valves 100 may be either less or greater than three.

In FIG. 7B, in a second embodiment, the housings 102, 120 of three individual valves 100 are combined in respective integral parts to form an apparatus 712. Each valve becomes a valve section 704*a*, 704*b*, or 704*c* (depicted using broken lines) within the unitary apparatus 712 for synchronized pulsing of three individual gases. The driving shafts in the valve sections may be replaced with a common driving shaft 706, as shown in FIG. 7B, or connected using the keyed couplings (702 in FIG. 7A). Similarly to the apparatus 710, in other embodiments, a number of combined valve sections may be either less or greater than three.

In either embodiment, the coupled driving shafts 182*a*, 182*b*, and 182*c* or a common driving shaft 706 may be coupled to a single drive 181. Further, the angular positions of the selector cams 106*a*–106*c* in the valves 100*a*–100*c* of the apparatus 710 or in the valve sections 704*a*–704*c* of the apparatus 712 may mutually be aligned to facilitate pulsing of the respective gases in a predetermined order. As such, pulses of gas produced by one valve in the apparatus 710, or one valve section in the apparatus 712, may be synchronized in time (discussed in reference to FIG. 5 below) with the pulses produced by other valves (apparatus 710) or other sections (apparatus 712).

In one exemplary application, a process, e.g., the ALD process, uses two pulsed reactive precursor gases A and B and one pulsed inert gas C, wherein a pulse of the inert gas C separates pulses of the gases A and B. Such sequence of pulses may be produced by both apparatuses 710 and 712, as shown in FIG. 5 below.

Figure 5:
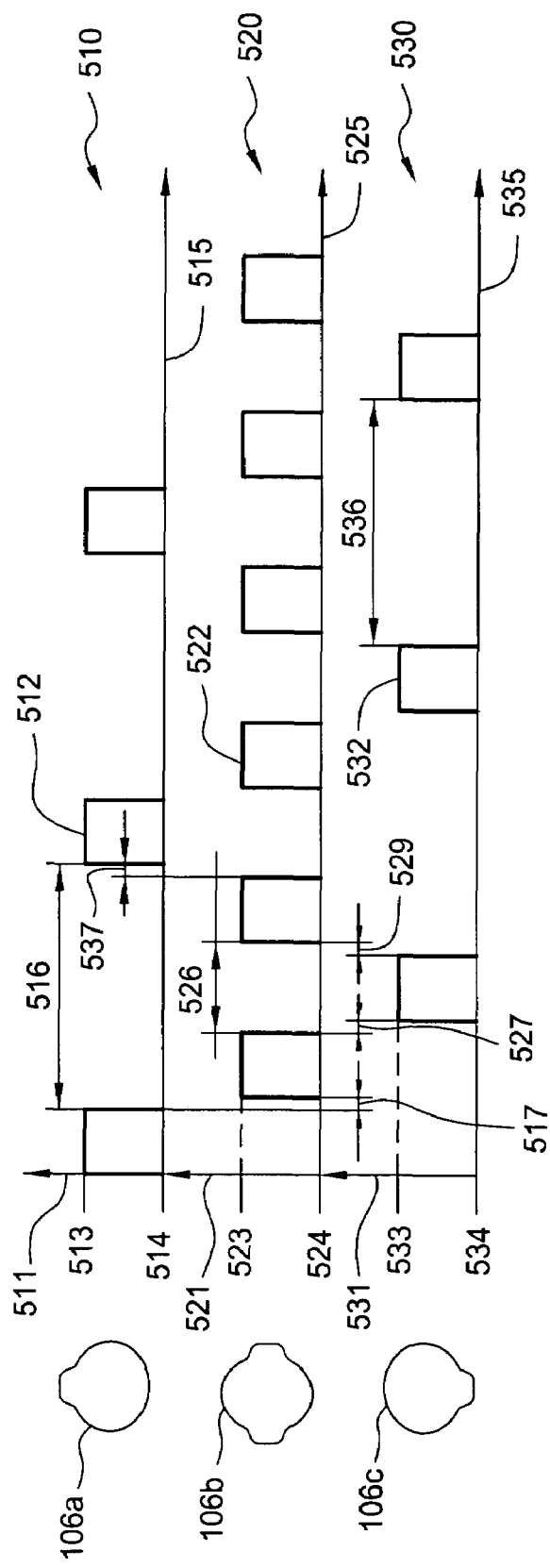
FIG. 5 depicts illustrative timing diagrams of the gas valve of FIG. 1.

FIG. 5 is an exemplary graph of illustrative timing diagrams of pulses of gases produced by either apparatus 710 or apparatus 712. In this example, the selector cams 106*a*, 106*b*, and 106*c* of the individual valves (apparatus 710) or valve sections (apparatus 712) have been formed and aligned as illustrated in the sketches on the left from the respective timing diagram. Any such selector cam and the corresponding timing diagram may belong interchangeably to any individual valve or section, i.e., an order in which the cams are positioned within the apparatus is not critical.

In the depicted embodiment, the inert gas C is coupled to a valve or valve section comprising a selector cam having two timing lobes. Further, each of the reactive precursor gases A and B is coupled, interchangeably, to a valve or valve section comprising a selector cam having one timing lobe. In FIG. 5, for purposes of clarity, graphical images of pulses of gas are reduced to a rectangular shape and the pulses are depicted as having the same duration and velocity of the selector cam 106 is assumed to be constant. Similar to FIG. 4, the images in FIG. 5 are not depicted to scale.

FIG. 5 depicts exemplary graphs of illustrative timing diagrams of the gas valve of FIG. 1. A first graph 510 depicts a status (axis 511) of a pulse 512 having the states ON (513) and OFF (514) versus time (axis 515) of a first gas, e.g., gas A, coupled to, for example, the valve 100*a* or section 704*a*. Herein, similar to the graph in FIG. 4, the ON state relates to a state of established fluid communication between the respective gas channel and the chamber 108 and the OFF state relates to a period between pulses of gas.

Correspondingly, a second graph 520 depicts a status (axis 521) of a pulse 522 having the states ON (523) and OFF (524) versus time (axis 525) of a second gas, e.g., gas C, coupled to, for example, the valve 100*c* or section 704*c*. Further, a third graph 530 depicts a status (axis 531) of a pulse 532 having the states ON (533) and OFF (534) versus time (axis 535) of a third gas B, coupled to the valve 100*b* or section 704*b*.

Periods 516, 526, and 536 relate to the gas cutoff periods between the pulses of the same gas and, similarly, periods 517, 527, 529, and 537 relate to the gas cutoff periods between the pulses of the different gases. In an alternative embodiment, at least one of such periods may have a different duration than the others. One skilled in the art will appreciate that a plurality of other synchronized sequences of pulses of the gases A, B, and C may be produced by varying number, length, and angular alignment of the timing lobes of the selector cams 106*a*, 106*b*, 106*c* and/or diameters of the cams.

Figure 6:
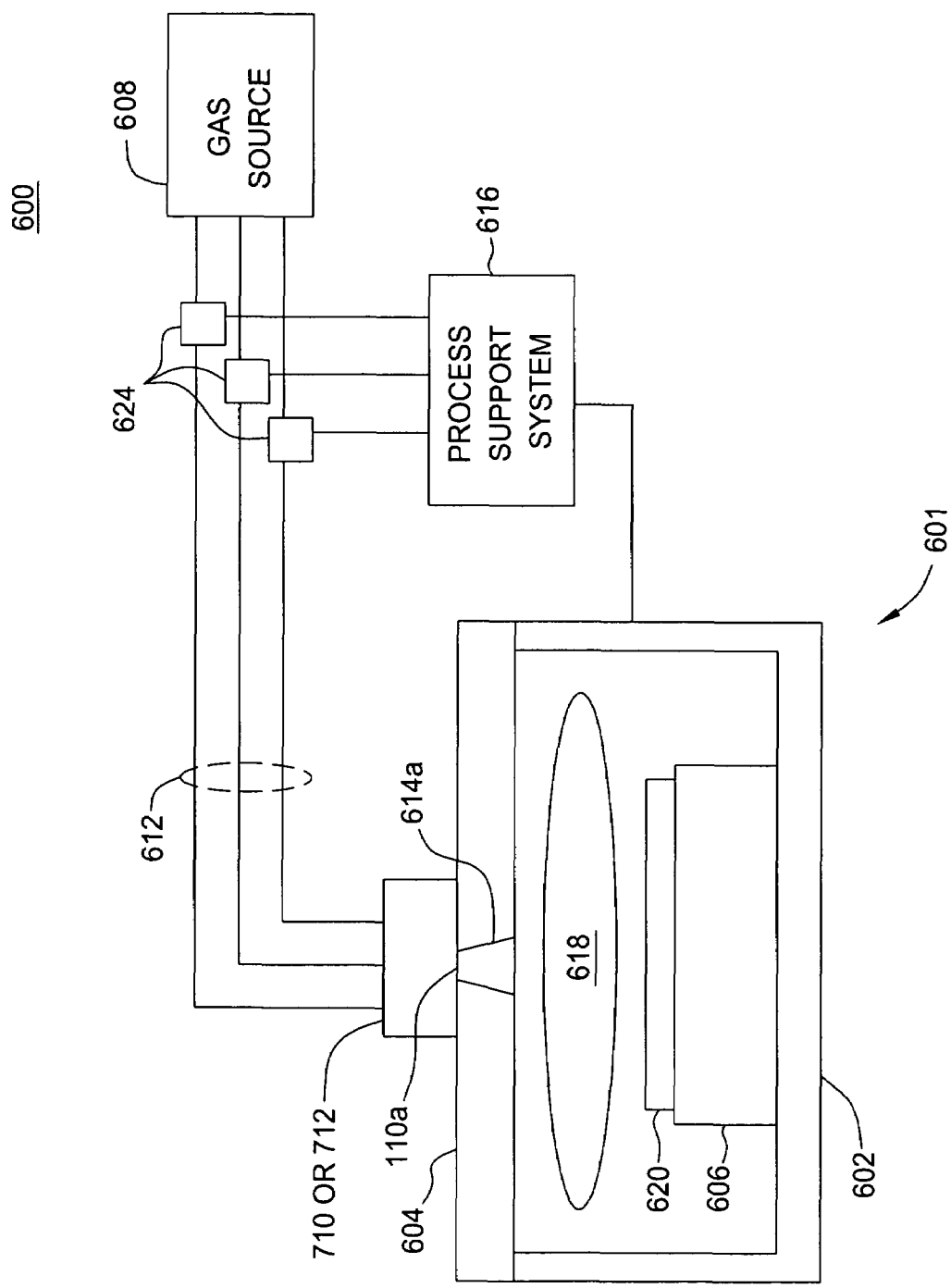
FIG. 6 is a schematic view of one example of an application for the gas valve of FIG. 1 as used in conjunction with a processing chamber of an ALD reactor.

FIG. 6 is a schematic, cross-sectional view of a deposition chamber 601 of a reactor of semiconductor substrate processing system 600 for performing a cyclical deposition process, e.g., an ALD reactor and the like. The chamber 601 comprises a lower portion 602 and an upper portion 604. The lower portion 602 comprises a pedestal 606 to support a substrate 620 (e.g., a silicon (Si) wafer) during processing. The lower portion 602 is coupled to a process support system 616 and the upper portion 604 is coupled to a gas source 608. The system 616 comprises means for controlling a temperature of the substrate, a gas pressure in the chamber 601, power supplies, and the like. The gas source 608 comprises the reactant and inert gases that are used during an ALD process and equipment for regulating a pressure and a flow of each gas.

The upper portion 604 encapsulates a reaction volume 618 above the substrate 620 and comprises the apparatus 710 or 712 and tree intake port 614a–614c (port 614a is shown). The intake port 614 is used for the introduction of one reactant gas into the deposition chamber 601. The intake ports 614 generally are disposed above a center region of the pedestal 606 and may comprise a showerhead or nozzle for distributing the gas proximate the substrate 620. The upper portion 604 is coupled to a gas source 608 using a plurality of vacuum-grade gas lines 612 that are chemically resistant to the gases being transported to the chamber 601. In operation, the outlets of the gas source 608 that relate to such gases are coupled to the respective inlet ports of the apparatus 710 or 712 using the gas lines 612, each comprising a controlled gas regulator 624, such as a shutoff valve, a mass flow controller (MFC), or a combination of the shutoff valve and MFC. As described above in reference to FIGS. 7A–B, the lines 612 are plumbed to the inlet ports of the apparatus 710 or 712, with respect to configuration of the selector cams, as discussed above.

In one embodiment, the apparatus 710 or 712 is mounted upon the upper portion 604 in a manner that the outlet ports 110a–100c fully are aligned with the respective intake ports 614. In such embodiment, a volume of a flow path between the outlet port (port 110a is shown) and the reactive volume in the processing chamber 601 is minimized and gas conductance of the flow path is maximized. As such, the flow path has a minimal impact on the form factor of the pulses of gas that are formed by the valve 100 and delivered into the chamber 601.

The apparatus 710 or 712 that is shown and described in reference to FIGS. 1–7B may be adapted for performing various deposition processes such as the ALD process or other form of a cyclical layer deposition process, a pulsed chemical vapor deposition, and the like. The ALD process generally uses, in a form of pulses having a duration of about 50 to 300 msec, reactive precursor, reducing agent, oxidizing agent, catalyst, inert, and the like gases. Each deposited layer may have a thickness less than a monolayer, as a monolayer, or greater than a monolayer of the respective material. Pulsing of the reactant gases may be repeated to deposit a plurality of such layers, each having a highly controlled thickness and forming an integral conformal film of a desired thickness. In exemplary applications, the apparatus 710 or 712 may be used in the deposition chamber 601 to form layers of nitrides, oxides, metals, organosilanes, organosiloxanes, dielectrics with either low or high dielectric constant, and the like.

In one specific example, the deposition chamber 601 may be used to deposit a tantalum nitride (TiN) film. In this example, the chamber 601 comprises the valve 100 having a first inlet (e.g., an inlet of the valve 100a or valve section 704a) coupled to a source of a first reactant gas such as pentadimethylamino-tantalum ($Ta(NMe_2)_5$), a third inlet (e.g., an inlet of the valve 100c or valve section 704c) coupled to a source of a second reactant gas such as ammonia ($NH_4$), and a second inlet (e.g., an inlet of the valve 100b or valve section 704b) coupled to a source of a purge gas such as argon (Ar) or helium (He).

Although the forgoing discussion referred to a gas valve for pulsing of gases used a semiconductor substrate processing system, other applications wherein the pulsed gases are employed can benefit from the invention. The invention can find a use in various apparatuses for perform accurate dosing or rapid pulsing of the gases and wherein the design parameters of the inventive gas valve may be adjusted to achieve acceptable characteristics by those skilled in the art by utilizing the teachings disclosed herein without departing from the spirit of the invention.

While foregoing is directed to the illustrative embodiment of the present invention, other and further embodiments of the invention may be devised without departing from the basic scope thereof, and the scope thereof is determined by the claims that follow.

What is claimed is:

1. A gas valve for pulsing a gas, comprising:
   a housing having an inlet port and an outlet port;
   a selector cam having at least one timing lobe;
   a membrane positioned proximate the inlet port; and
   a pivotally mounted actuator for selectively engaging the membrane with the inlet port, wherein a rotation of the selector cam selectively engages the pivotally mounted actuator.

2. The gas valve of claim 1, wherein the membrane seals the inlet port when the pivotally mounted actuator engages the membrane.

3. The gas valve of claim 1, wherein the membrane in a free state fluidly couples the inlet port to the outlet port.

4. A gas valve for pulsing a gas, comprising:
   a housing having an inlet port and an outlet port;
   a membrane positioned proximate the inlet port; and
   a pivotally mounted actuator for selectively engaging the membrane with the inlet port, wherein the pivotally mounted actuator comprises a shaft and a bias member to bias the shaft against the housing.

5. The gas valve of claim 4, wherein the selector cam and the bias member engage the shaft to reciprocate and selectively engage the membrane with the inlet port.

6. A system for processing semiconductor wafers comprising:
   a processing chamber;
   a source of at least one gas; and
   a gas valve for pulsing said at least one gas to the processing chamber, comprising:
   a housing having an inlet port, an outlet port, and a selector cam having at least one timing lobe;
   a membrane positioned proximate the inlet port; and
   a pivotally mounted actuator for selectively engaging the membrane with the inlet port, wherein a rotation of the selector cam selectively engages the pivotally mounted actuator.

7. The system of claim 6, wherein the membrane seals the inlet port when the pivotally mounted actuator engages the membrane.

8. The system of claim 6, wherein the membrane in a free state fluidly couples the inlet port to the outlet port.

9. The system of claim 6, wherein the pivotally mounted actuator comprises a shaft and a bias member to bias the shaft against the housing.

10. The system of claim 9, wherein the selector cam, and the bias member engage the shaft to reciprocate and selectively engage the membrane with the inlet port.

11. An apparatus for pulsing a plurality of gases, comprising:

a plurality of cooperating gas valves coupled to a single drive, each of said gas valves comprising:
    a housing having an inlet port and an outlet port;
    a membrane positioned proximate the inlet port;
    an actuator for selectively engaging the membrane with the inlet port, wherein the actuator comprises:
        a driving shaft and a bias member to bias the driving shaft against the housing, and;
        a selector cam having at least one timing lobe, wherein a rotation of the cam selectively engages the actuator.

12. The apparatus of claim 11, wherein the membrane seals the inlet port when the actuator engages the membrane.

13. The apparatus of claim 11, wherein the membrane in a free state fluidly couples the inlet port to the outlet port.

14. The apparatus of claim 11, wherein the selector cam and the bias member engage the driving shaft to reciprocate and selectively engage the membrane with the inlet port.

15. The apparatus of claim 11, wherein the plurality of cooperating gas valves are coupled together to form a single part.

16. An apparatus for pulsing a plurality of gases, comprising:
    a plurality of cooperating gas valves coupled to a single drive, each of said gas valves comprising:
        a housing having an inlet port, and an outlet port;
        a selector cam having at least one timing lobe;
        a membrane positioned proximate the inlet port; and
        an actuator for selectively engaging the membrane with the inlet port, wherein a rotation of the selector cam selectively engages the actuator and the selector cam in each housing is sequentially coupled.

17. The apparatus of claim 16, wherein an angular position of each selector cam is aligned for pulsing the gases in a predetermined order.

18. An apparatus for pulsing a plurality of gases, comprising:
    a plurality of cooperating gas valves coupled to a single drive, each of said gas valves comprising:
        a housing having an inlet port and an outlet port;
        a selector cam;
        a driving shaft that is common to said gas valves;
        a membrane positioned proximate the inlet port; and
        an actuator for selectively engaging the membrane with the inlet port.

19. The apparatus of claim 18, wherein an angular position of each selector cam is aligned for pulsing the gases in a predetermined order.

20. The apparatus of claim 19, wherein the plurality of cooperating gas valves are coupled together to form a single part.

* * * * *

UNITED STATES PATENT AND TRADEMARK OFFICE
CERTIFICATE OF CORRECTION

PATENT NO. : 6,994,319 B2
APPLICATION NO. : 10/354600
DATED : February 7, 2006
INVENTOR(S) : Joseph Yudovsky It is certified that error appears in the above-identified patent and that said Letters Patent is hereby corrected as shown below:

<u>In the Specification</u>

Column 4, Line 9: Delete "$(NH_4)$"

Column 9, Line 67: Delete "$(NH_4)$"

Signed and Sealed this

First Day of August, 2006

JON W. DUDAS
*Director of the United States Patent and Trademark Office*